(12) United States Patent
Nagae et al.

(10) Patent No.: US 9,403,553 B2
(45) Date of Patent: Aug. 2, 2016

(54) LOAD CONTROL DEVICE, ELECTRIC POWER STEERING DEVICE, AND METHOD FOR CONTROLLING LOAD CONTROL DEVICE

(71) Applicant: KAYABA INDUSTRY CO., LTD., Tokyo (JP)

(72) Inventors: Kouki Nagae, Kanagawa (JP); Junichi Owaki, Aichi (JP)

(73) Assignee: KYB Corporation, Tokyo (JP)

( * ) Notice: Subject to any disclaimer, the term of this patent is extended or adjusted under 35 U.S.C. 154(b) by 0 days.

(21) Appl. No.: 14/772,250

(22) PCT Filed: Mar. 12, 2014

(86) PCT No.: PCT/JP2014/056432
§ 371 (c)(1),
(2) Date: Sep. 2, 2015

(87) PCT Pub. No.: WO2014/156633
PCT Pub. Date: Oct. 2, 2014

(65) Prior Publication Data
US 2016/0001812 A1 Jan. 7, 2016

(30) Foreign Application Priority Data
Mar. 26, 2013 (JP) .................. 2013-064418

(51) Int. Cl.
*B62D 6/00* (2006.01)
*B62D 5/04* (2006.01)
*G01R 1/20* (2006.01)

(52) U.S. Cl.
CPC ............ *B62D 5/0463* (2013.01); *B62D 5/0481* (2013.01); *G01R 1/203* (2013.01); *H02P 2205/05* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,569,991 A | * | 10/1996 | Matsuoka | B62D 5/0466 180/446 |
| 2007/0165431 A1 | | 7/2007 | Gunji | |
| 2012/0013282 A1 | * | 1/2012 | Introwicz | H02P 6/186 318/400.06 |
| 2015/0276812 A1 | * | 10/2015 | Ferguson | G01R 1/30 324/123 R |

FOREIGN PATENT DOCUMENTS

JP 2007-189825 A 7/2007

* cited by examiner

*Primary Examiner* — Edward J Pipala
(74) *Attorney, Agent, or Firm* — Rabin & Berdo, P.C.

(57) ABSTRACT

A load control device includes a load control means that drives a load, a current detection resistor, a differential amplifier and a current calculation means. The load control means can switch between a standby state a drive state, a state in which a first of the switching elements is turned ON and a second of the switching elements is turned OFF and a state in which the first of the switching elements is turned OFF and the second of the switching elements is turned ON being alternately repeated in the standby state, in which both of the switching elements are turned ON in the drive state. The current calculation means calculates a current that flows to the current detection resistor on the basis of a value output from the differential amplifier in the drive state and an offset value output from the differential amplifier in the standby state.

4 Claims, 5 Drawing Sheets

LOAD CONTROL DEVICE, ELECTRIC POWER STEERING DEVICE, AND METHOD FOR CONTROLLING LOAD CONTROL DEVICE

TECHNICAL FIELD

The present invention relates to a load control device, an electric power steering device, and a method for controlling the load control device.

BACKGROUND ART

In a well-known electric power steering device, an assist force corresponding to a steering torque input into a steering wheel is generated by a motor. Such an electric power steering device includes an inverter circuit interposed between the motor and a power source, and a controller that ON/OFF controls switching elements of the inverter circuit. The switching elements switch a connection between the power source and the motor between an ON state and an OFF state on the basis of a PWM signal transmitted from the controller.

JP2007-189825A discloses an electric power steering device like that described above which comprises a voltage detection device in which a current detection resistor is serially interposed between the power source and the switching elements and a voltage drop generated by the current detection resistor is detected upon amplification by a differential amplifier. The voltage detection device estimates a current value flowing through the inverter circuit on the basis of the detected voltage value.

SUMMARY OF INVENTION

The differential amplifier has two input terminals and one output terminal, and outputs a potential difference between the input terminals from the output terminal. The voltage detection device obtains an output value of the differential amplifier in a state after the power source of the controller has entered an ON state and a voltage is not being applied between the input terminals of the differential amplifier, and saves the output value as an initial value. Subsequently, when a voltage is applied between the input terminals, the voltage detection device compares the output value of the differential amplifier with the saved initial value to calculate the voltage between the input terminals.

However, in a state in which a voltage is applied to the two input terminals, due to the characteristics of the differential amplifier, the output value of the differential amplifier includes the influence of an input offset voltage and a common-mode rejection ratio that differs depending on the element. Therefore, there may be an error between the voltage detected by the voltage detection device and the actual voltage between the input terminals, and thus the detection precision of the current value of the inverter circuit may decrease.

An object of the present invention is to provide a load control device capable of precisely detecting a current value within a circuit.

According to one aspect of the present invention, a load control device includes: a load control means configured to ON/OFF operate switching elements on the basis of a PWM signal, the switching elements being interposed in each of an upper arm and a lower arm that connect a power source and a load; a current detection resistor connected in series with the load; a differential amplifier configured to amplify and output a voltage generated in the current detection resistor; and a current calculation means configured to calculate a current flowing to the current detection resistor on the basis of an output value of the differential amplifier. The load control means is configured to switch between a standby state and a drive state, a state in which a first of the switching elements is turned ON and a second of the switching elements is turned OFF and a state in which the first of the switching elements is turned OFF and the second of the switching elements is turned ON being alternately repeated in the standby state, in which both of the switching elements being turned ON to cause a current to flow to the load in the drive state, and the current calculation means is configured to set a value output from the differential amplifier as an offset value in the standby state, and calculate a current that flows to the current detection resistor on the basis of a value output from the differential amplifier and the offset value in the drive state.

DESCRIPTION OF EMBODIMENTS

Hereinafter, embodiments of the present invention are described with reference to the drawings.

Figure 1:
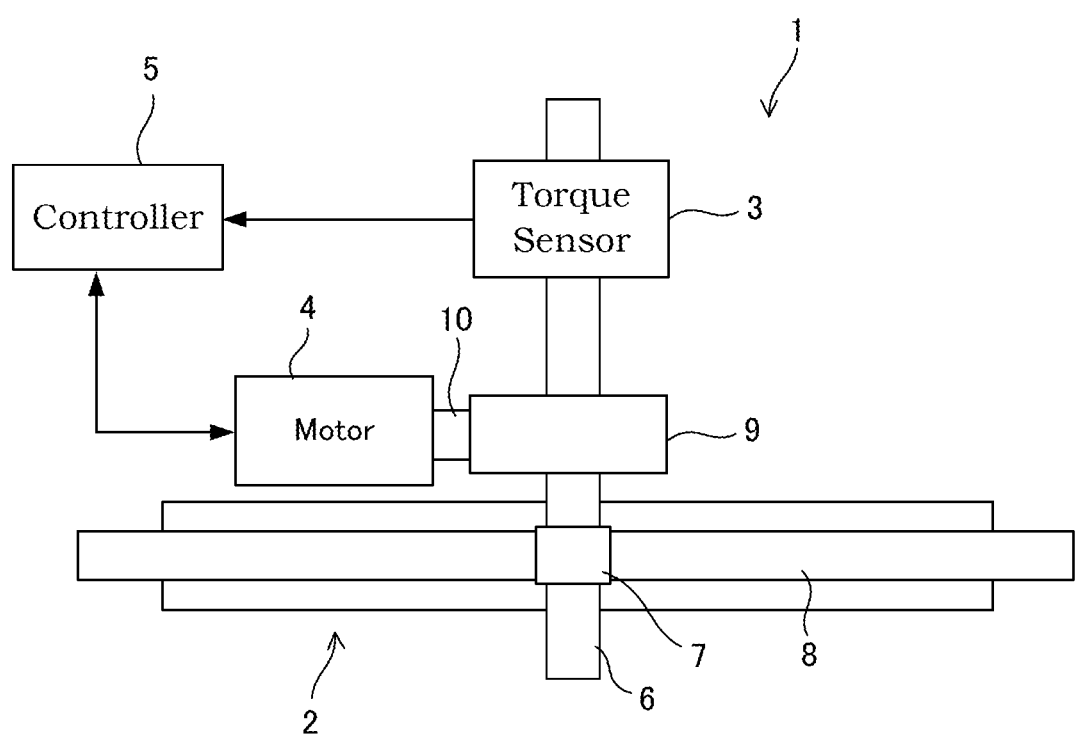
FIG. 1 is a schematic view illustrating an electric power steering device equipped with a motor control device according to an embodiment of the present invention.

FIG. 1 is a schematic view illustrating an electric power steering device 1 equipped with a motor control device according to an embodiment of the present application.

The electric power steering device 1 includes a steering mechanism 2 that is connected to a steering wheel (not illustrated) and steers a vehicle wheel (not illustrated), a torque sensor 3 that detects an input torque, an electric motor 4 (hereinafter referred to simply as the "motor 4") that serves as a load which imparts an assist torque to the steering mechanism 2, and a controller 5 that serves as a load control means into which a detection signal from the torque sensor 3 is input and which controls an output of the motor 4.

The steering mechanism 2 includes a steering shaft 6 that is connected to the steering wheel, a pinion 7 formed on the steering shaft 6, and a rack 8 that engages with the pinion 7. When the pinion 7 rotates due to rotation of the steering shaft 6, the rack 8 which engages with the pinion 7 moves in an axial direction (left-right direction of a vehicle) and the wheel is steered via a tie rod (not illustrated) connected to the rack 8.

The steering mechanism 2 further includes a worm wheel 9 that is connected to the steering shaft 6 and a worm 10 that engages with the worm wheel 9. The worm 10 is connected to an output shaft of the motor 4. When the motor 4 drives the worm 10 to rotate, the worm wheel 9 is driven to rotate, and thereby an assist torque is imparted to the steering shaft 6.

The torque sensor 3 is interposed on the steering shaft 6, and detects an input torque that is imparted to the steering shaft 6 by a driver via the steering wheel.

The controller 5 calculates the assist torque on the basis of a torque detection signal input from the torque sensor 3, and controls the output of the motor 4.

Figure 2:
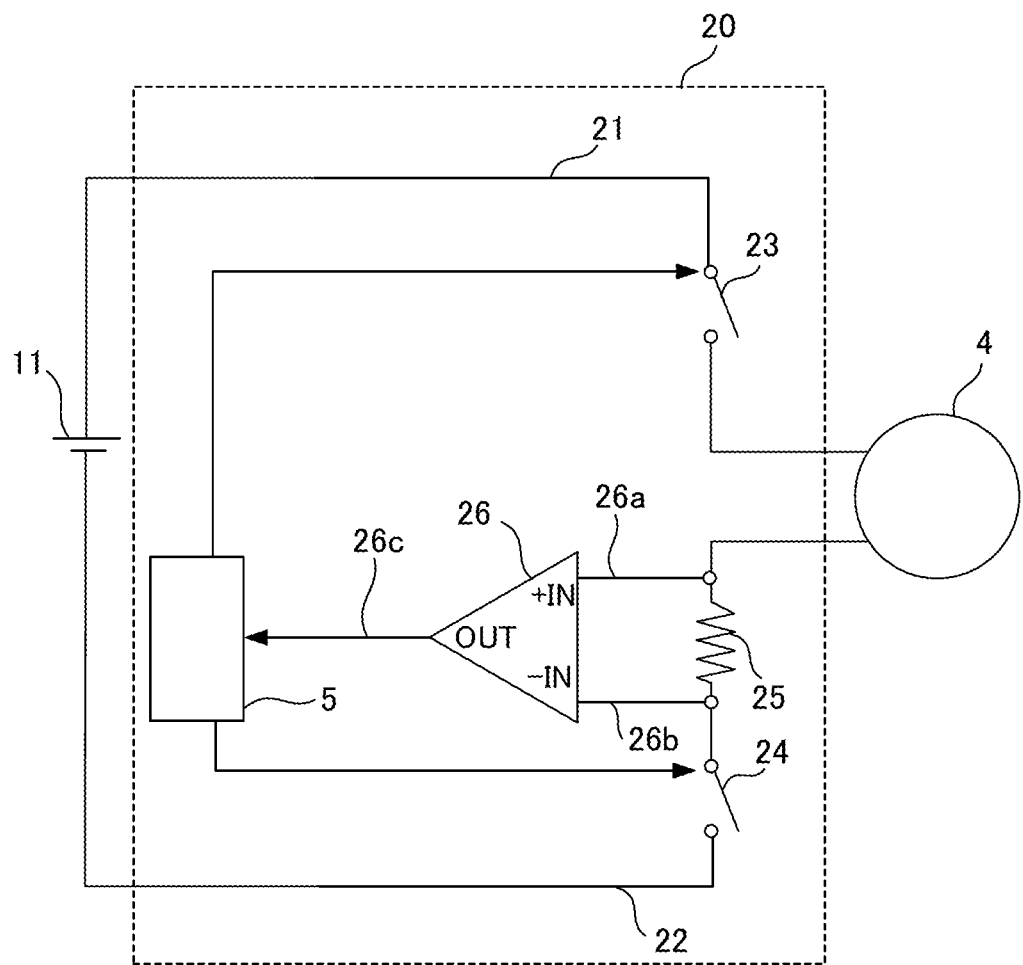
FIG. 2 is a schematic view illustrating the motor control device according to the embodiment of the present invention.

The control of the motor 4 by the controller 5 will now be explained below. FIG. 2 is a schematic view illustrating a motor control device 20 in the present embodiment.

The motor control device 20 serving as a load control device includes an upper arm 21 and a lower arm 22 that connect a power source 11 to the motor 4, an upper switching element 23 that is interposed on the upper arm 21, a lower switching element 24 interposed on the lower arm 22, and the controller 5 that ON/OFF operates the upper switching element 23 and the lower switching element 24.

The power source 11 is a battery of a vehicle equipped with the electric power steering device 1. The motor 4 is a three-phase AC motor. In FIG. 2, only a single pair of the upper arm 21 and the lower arm 22 is illustrated for the sake of simplifying the explanation, but actually three pairs of the upper arm 21 and the lower arm 22 corresponding respectively to a U-phase, a V-phase, and a W-phase of a stator coil of the motor 4 are provided in parallel to the power source 11.

The controller 5 outputs a PWM signal having a predetermined duty ratio to the upper switching element 23 and the lower switching element 24 on the basis of the calculated assist torque.

The controller 5 can switch between standby control and motor drive control. In the standby control, a state in which the upper switching element 23 is turned ON and the lower switching element 24 is turned OFF and a state in which the upper switching element 23 is turned OFF and the lower switching element 24 is turned ON are alternately repeated. In the motor drive control, both of the upper switching element 23 and the lower switching element 24 are turned ON to drive the motor 4.

The motor drive control is carried out when it is determined that an assist torque of the motor 4 must be imparted to the steering shaft 6 upon operation of the steering wheel by the driver.

The standby control is carried out when the ignition switch of the vehicle enters an ON state and the controller 5 starts up. In other words, during operation of the vehicle, the standby control is always carried out, and is appropriately switched to the motor drive control according to the operation of the driver.

When the standby control is carried out, a step voltage of a predetermined period is applied to the motor 4. Thus, if assist torque by the motor 4 subsequently becomes necessary, the motor 4 can be quickly driven.

The motor control device 20 further includes a current detection resistor 25 that is interposed on the lower arm 22 more toward the motor 4 side than the lower switching element 24, and a differential amplifier 26 that detects a voltage drop that occurs in the current detection resistor 25 and then amplifies and outputs it.

The current detection resistor 25 is serially connected to the motor 4. The differential amplifier 26 includes a plus input terminal 26a and a minus input terminal 26b that are respectively connected to both ends of the current detection resistor 25, and an output terminal 26c that is connected to the controller 5. The differential amplifier 26 amplifies a potential difference between the plus input terminal 26a and the minus input terminal 26b and transmits it to the controller 5 via the output terminal 26c.

The controller 5 serving as a current calculation means estimates a current value flowing to the current detection resistor 25 on the basis of the value received from the differential amplifier 26. The current value is estimated on the basis of a map that defines the relationship between an output value of the differential amp 26 and the current value that is calculated in advance through experimentation or the like.

The controller 5 performs feedback control of the duty ratio of the PWM signal such that the current value that is estimated as described above reaches a target value of the motor current value necessary for the motor 4 to exert the assist torque.

The PWM signal output and the motor current value calculation by the controller 5 will now be explained below. The explanation of feedback control will be omitted in order to simplify the explanation.

Figure 3:
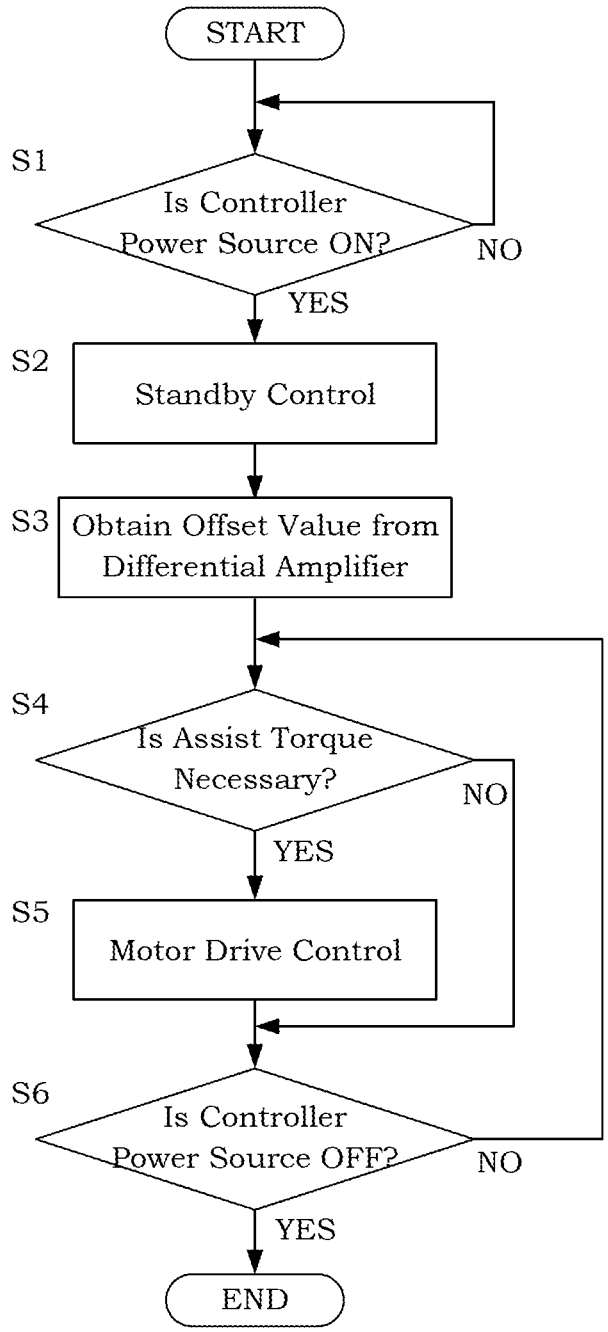
FIG. 3 is a flowchart illustrating processing content executed by a controller.

FIG. 3 is a flowchart illustrating processing content executed by the controller 5.

In step S1, the controller 5 determines whether the power source of the controller 5 is ON. If it is determined that the power source of the controller 5 is ON, the processing proceeds to step S2. If it is determined that the power source is OFF, step S1 is carried out again. When a driver turns ON the ignition switch of the vehicle and the controller 5 is started up, it is determined that the power source of the controller 5 is ON.

In step S2, the controller 5 carries out the standby control. In other words, the controller 5 alternately repeats a state in which the upper switching element 23 is turned ON and the lower switching element 24 is turned OFF and a state in which the upper switching element 23 is turned OFF and the lower switching element 24 is turned ON.

In step S3, the controller 5 obtains an offset value from the differential amplifier 26. The offset value is the output value of the differential amplifier 26 at that time.

Herein, the offset value will now be explained below.

If the standby control is initiated in step S2, a step voltage of a predetermined period is applied to the motor 4. In the standby control, the upper switching element 23 and the lower switching element 24 are never simultaneously ON, and thus there is never enough current flowing to drive the motor 4.

However, since the upper switching element 23 and the lower switching element 24 are ON/OFF operated in order, a step voltage is constantly applied to the current detection resistor 25. Therefore, the output value of the differential amplifier 26 includes the influence of an input offset voltage and a common-mode rejection ratio.

Figure 4A:
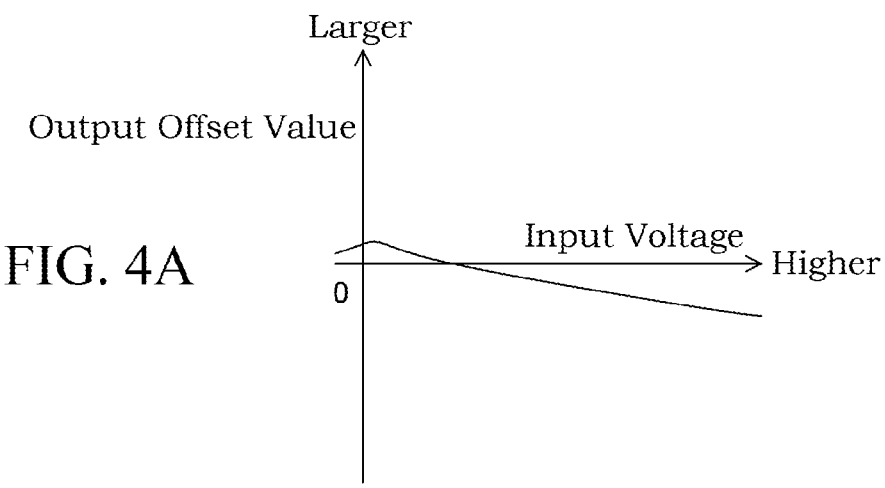
FIG. 4A is a diagram for explaining an input offset voltage.

FIG. 4A is a diagram for explaining the input offset voltage. The horizontal axis shows an input voltage and the vertical axis shows an output offset value.

The input voltage is a potential different between the plus input terminal 26a and the minus input terminal 26b of the differential amplifier 26, and the output offset value is an amount of deviation from the input voltage. As shown in FIG. 4A, the output value of the differential amplifier 26 is output as a value obtained by adding the output offset value to the input voltage. Thus, the output value of the differential amplifier 26 includes minor errors according to the input voltage.

Figure 4B:
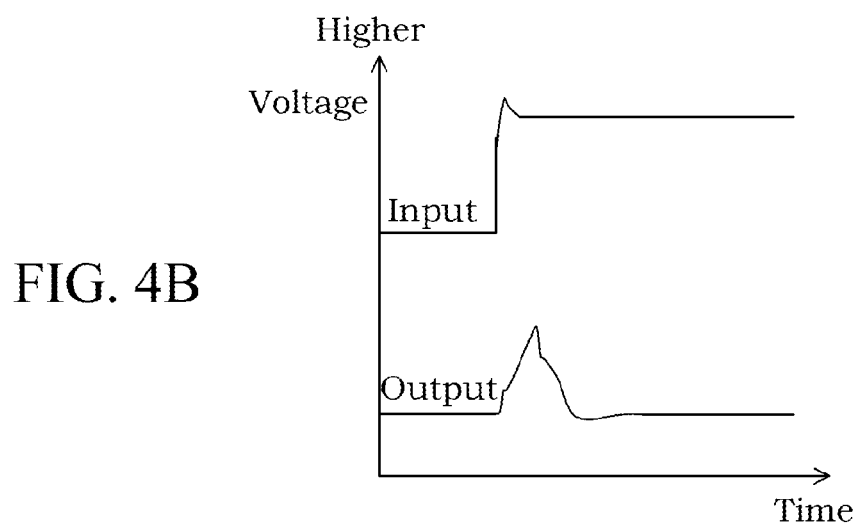
FIG. 4B is a diagram for explaining a common-mode rejection ratio.
Figure 4C:
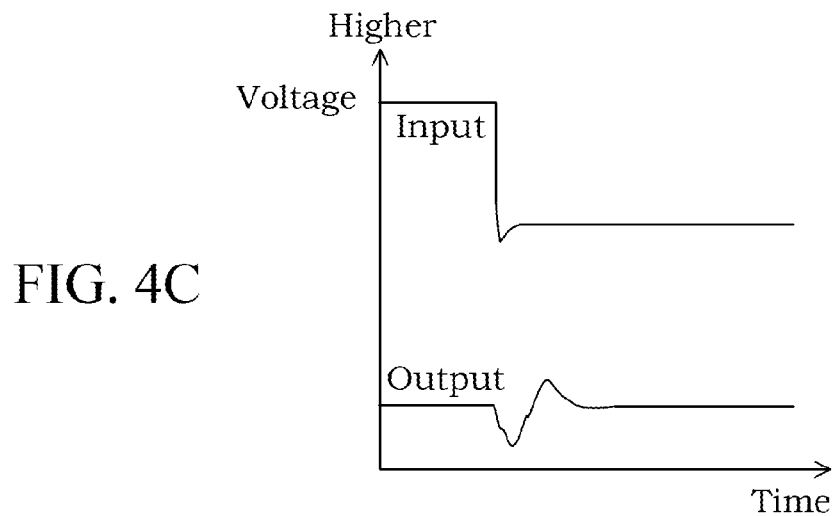
FIG. 4C is another diagram for explaining the common-mode rejection ratio.

FIGS. 4B and 4C are diagrams for explaining the common-mode rejection ratio. In both FIGS. 4B and 4C, the upper part shows a time change of the input voltage and the lower part shows a time change of the output voltage.

As shown in FIG. 4B, if the input voltage of the differential amplifier 26 rises in a stepped fashion, the output value of the differential amplifier 26 fluctuates up and down and noise is output. Similarly, as shown in FIG. 4C, if the input voltage of the differential amplifier 26 drops in a stepped fashion, the output value of the differential amplifier 26 fluctuates up and down and noise is output. Noise of the differential amplifier 26 is a value that changes according to the frequency of the step voltage, and the influence of noise increases as the frequency becomes higher.

In this way, if a step voltage is applied to the plus input terminal 26a and the minus input terminal 26b, the output value of the differential amplifier 26 is offset from the input value by an amount of influence received from the input offset voltage and the common-mode rejection ratio. A value including this offset amount corresponds to the offset value mentioned above.

Returning to FIG. 3, in step S3, the controller 5 obtains a value output from the differential amplifier 26 when the step voltage is applied but a current is not flowing to the current detection resistor 25 as the offset value.

Figure 5:
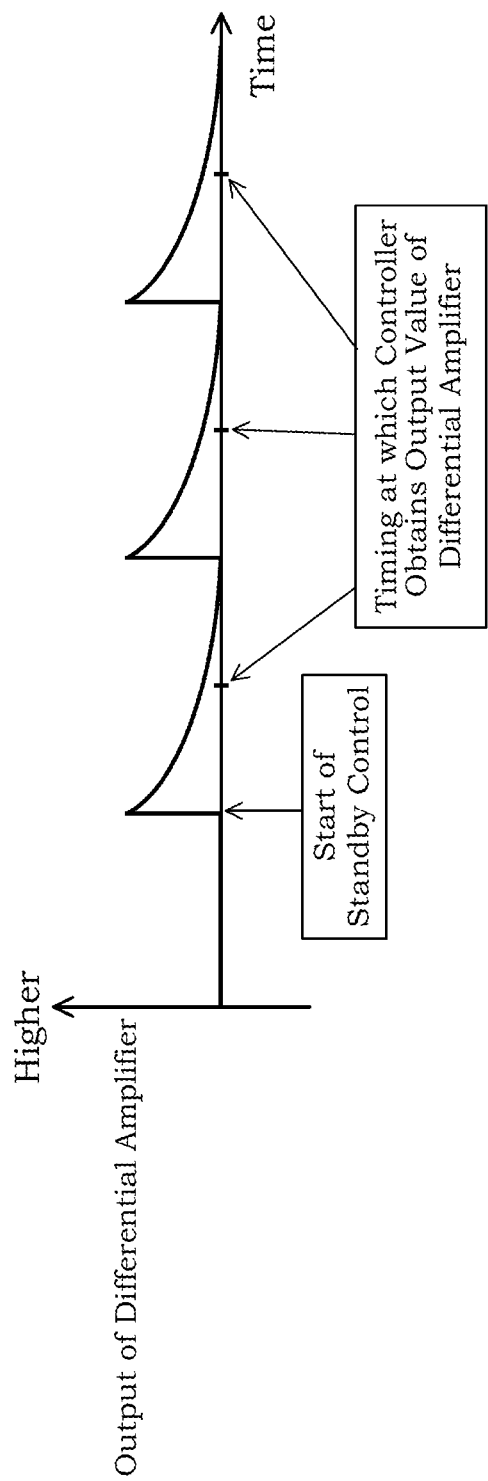
FIG. 5 is a time chart illustrating a time change of an output value of a differential amplifier.

FIG. 5 is a time chart illustrating a time change of the output value of the differential amplifier 26 during the standby control.

A low-pass filter consisting of a resistor and a capacitor (not illustrated) is disposed between the output terminal 26c of the differential amplifier 26 and the controller 5. Thus, the waveform of the output value of the differential amplifier 26 is not a square wave like a step voltage but rather a waveform in which the output value rises in a stepped fashion when a voltage is applied and then gradually decreases.

As shown in FIG. 5, the output value of the differential amplifier 26 changes over time, but the period in which the controller 5 obtains the output value from the differential amplifier 26 and the period of the step voltage are equal. Thus, the offset value obtained during the standby control is substantially constant regardless of the timing at which it is obtained.

Returning to FIG. 3, in step S4, the controller 5 determines whether an assist torque of the motor 4 is necessary. If it is determined that the assist torque is necessary, the processing proceeds to step S5. If it is determined that the assist torque is not necessary, the processing proceeds to step S6. When it is necessary to impart an assist torque to the steering shaft 6 upon operation of the steering wheel by the driver, it is determined that an assist torque is necessary.

In step S5, the controller 5 carries out the motor drive control. In other words, the controller 5 turns ON both of the upper switching element 23 and the lower switching element 24 to drive the motor 4.

In the motor drive control, the duty ratio of the PWM signal is feedback controlled such that the target value of the motor current value necessary for the motor 4 to exert the assist torque and the current value calculated by the controller 5 on the basis of the value output from the differential amplifier 26 become equal.

The controller 5 calculates the current value during the motor drive control on the basis of a value obtained by subtracting the offset value obtained in step S3 from the value output from the differential amplifier 26.

In step S6, the controller 5 determines whether the power source of the controller 5 is OFF. If it is determined that the power source of the controller 5 is OFF, the processing finishes. If it is determined that the power source of the controller 5 is ON, the processing returns to step S4. When the driver turns OFF the ignition switch of the vehicle, it is determined that the power source of the controller 5 is OFF.

To summarize the control discussed above, after the controller 5 is started up, the standby control is initiated and then the output value of the differential amplifier 26 is obtained as the offset value. Subsequently, the standby control is continued, and the motor drive control is only executed when an assist torque of the motor 4 has become necessary. The current value during the motor drive control is calculated on the basis of a value obtained by subtracting the offset value from the value output from the differential amplifier 26.

Thereby, the current value can be calculated taking into account any influence of output errors from the differential amplifier 26, and thus the current value flowing through the current detection resistor 25 can be precisely detected. Accordingly, feedback control of the duty ratio of the PWM signal can be precisely carried out, and an appropriate assist torque can be imparted to the steering shaft 6.

According to the above-described embodiment, the following effects are achieved.

During the standby control, the value output from the differential amplifier 26 is obtained as the offset value, and during the motor drive control, the current flowing to the current detection resistor 25 is calculated on the basis of the value output from the differential amplifier 26 and the offset value. Thus, the current flowing to the current detection resistor 25 can be calculated considering any errors in the detected value caused by the characteristics of the differential amplifier 26 that occur when a step voltage is applied by the standby control. Therefore, the current value within the circuit of the motor control device 20 can be precisely detected.

Further, the controller 5 calculates the current flowing to the current detection resistor 25 on the basis of a value obtained by subtracting the offset value from the value output from the differential amplifier 26 when in a motor drive state. Therefore, the current flowing to the current detection resistor 25 can be calculated on the basis of the output value of the differential amplifier 26 when a step voltage is applied by the standby control. Accordingly, the current value within the circuit of the motor control device 20 can be more precisely detected.

Moreover, the motor 4 is used as an assist motor of the electric power steering device 1. Thus, by enhancing the detection precision of the current value within the circuit of the motor control device 20, a more appropriate assist torque can be imparted to the steering shaft 6.

Embodiments of this invention were described above, but the above embodiments are merely examples of applications of this invention, and the technical scope of this invention is not limited to the specific constitutions of the above embodiments.

For example, in the above-described embodiment, the motor control device 20 was exemplified. However, the present invention can also be applied to a control device of a load such as a solenoid instead of the motor 4.

Further, in the above-described embodiment, the motor control device 20 of the electric power steering device 1 was exemplified. However, the present invention can also be applied to a control device of the motor 4 used in another device.

Also, in the above-described embodiment, the controller 5 calculated the current value during the motor drive control on the basis of a value obtained by subtracting the offset value from the value output from the differential amplifier 26. However, instead of this method of calculation, the current value can also be calculated on the basis of the output of the differential amplifier 26 referring to a map prepared for each offset value.

In addition, in the above-described embodiment, the controller 5 controlled the output of the motor 4 and estimated the current value. However, a controller for motor control and a controller for estimating the current value can be provided separately.

Furthermore, in the above-described embodiment, a three-phase AC motor was exemplified as the motor. However, another type of motor can also be used.

This application claims priority based on Japanese Patent Application No. 2013-064418 filed with the Japan Patent Office on Mar. 26, 2013, the entire contents of which are incorporated into this specification.

The invention claimed is:

1. A load control device comprising:
   a load control means configured to ON/OFF operate switching elements on the basis of a PWM signal, the switching elements being interposed in each of an upper arm and a lower arm that connect a power source and a load;
   a current detection resistor connected in series with the load;
   a differential amplifier configured to amplify and output a voltage generated in the current detection resistor; and
   a current calculation means configured to calculate a current flowing to the current detection resistor on the basis of an output value of the differential amplifier,
   wherein the load control means is configured to switch between a standby state and a drive state, a state in which a first of the switching elements is turned ON and a second of the switching elements is turned OFF and a state in which the first of the switching elements is turned OFF and the second of the switching elements is turned ON being alternately repeated in the standby state, in which both of the switching elements being turned ON to cause a current to flow to the load in the drive state, and
   the current calculation means is configured to set a value output from the differential amplifier as an offset value in the standby state, and calculate a current that flows to the current detection resistor on the basis of a value output from the differential amplifier and the offset value in the drive state.

2. The load control device according to claim 1, wherein the current calculation means calculates a current that flows to the current detection resistor on the basis of a value obtained by subtracting the offset value from a value output from the differential amplifier in the drive state.

3. An electric power steering device comprising the load control device according to claim 1, the electric power steering device comprising:
   a steering mechanism configured to steer a wheel in association with rotation of a steering shaft; and
   an electric motor configured to impart an assist torque to the steering mechanism,
   wherein the load of the load control device is the electric motor.

4. A method for controlling a load control device configured to ON/OFF operate switching elements on the basis of a PWM signal, the switching elements being interposed in each of an upper arm and a lower arm that connect a power source and a load,
   wherein the load control device comprises a current detection resistor connected in series with the load, and a differential amplifier configured to amplify and output a voltage generated in the current detection resistor,
   the method comprising:
      alternately repeating a state in which a first of the switching elements is turned ON and a second of the switching elements is turned OFF and a state in which the first of the switching elements is turned OFF and the second of the switching elements is turned ON;
      setting a value output from the differential amplifier as an offset value;
      driving the load by turning ON both of the switching elements to cause a current to flow to the load; and
      calculating a current that flows to the current detection resistor on the basis of a value output from the differential amplifier and the offset value.

* * * * *